(12) United States Patent
Mallik et al.

(10) Patent No.: US 8,619,911 B2
(45) Date of Patent: Dec. 31, 2013

(54) QUADRATURE SIGNAL DECODING USING A DRIVER

(75) Inventors: Ranajay Mallik, Ghaziabad (IN);
Munish Mangal, Armritsar (IN)

(73) Assignee: STMicroelectronics International N.V., Amsterdam (NL)

( * ) Notice: Subject to any disclaimer, the term of this patent is extended or adjusted under 35 U.S.C. 154(b) by 967 days.

(21) Appl. No.: 12/719,698

(22) Filed: Mar. 8, 2010

(65) Prior Publication Data

US 2011/0142155 A1   Jun. 16, 2011

(30) Foreign Application Priority Data

Dec. 15, 2009 (IN) .......................... 2605/DEL/2009

(51) Int. Cl.
*H04L 27/00* (2006.01)
*H04L 27/02* (2006.01)

(52) U.S. Cl.
USPC .......................................... 375/316; 375/268

(58) Field of Classification Search
USPC .......... 375/316, 268; 345/168, 169, 170, 171; 341/22–26
See application file for complete search history.

(56) References Cited

U.S. PATENT DOCUMENTS

| | | | |
|---|---|---|---|
| 4,719,532 A | 1/1988 | Schneider | |
| 5,059,871 A | 10/1991 | Pearlman et al. | |
| 5,553,056 A | 9/1996 | Bronte et al. | |
| 5,914,677 A | 6/1999 | Ahmadian | |
| 6,035,240 A | 3/2000 | Moorehead et al. | |
| 6,077,246 A | 6/2000 | Kullas et al. | |
| 6,160,354 A | 12/2000 | Ruvinskiy et al. | |
| 7,010,423 B2 | 3/2006 | Piwonka et al. | |
| 7,027,526 B1 | 4/2006 | Nehoran et al. | |
| 7,038,665 B1 * | 5/2006 | Pandana ........................ 345/168 |
| 7,177,547 B1 | 2/2007 | Case et al. | |
| 7,876,807 B2 | 1/2011 | Ray et al. | |
| 2002/0196843 A1 | 12/2002 | Ben-Bassat et al. | |
| 2004/0022544 A1 | 2/2004 | Case et al. | |
| 2006/0031610 A1 | 2/2006 | Liav et al. | |
| 2006/0100723 A1 | 5/2006 | Sun et al. | |
| 2007/0078610 A1 | 4/2007 | Adams et al. | |
| 2007/0240001 A1 * | 10/2007 | Syed et al. ..................... 713/300 |
| 2007/0293817 A1 | 12/2007 | Feng et al. | |
| 2008/0288748 A1 | 11/2008 | Sutardja et al. | |
| 2009/0085488 A1 | 4/2009 | Bridges et al. | |
| 2009/0311985 A1 * | 12/2009 | Youssoufian et al. ...... 455/226.2 |
| 2009/0314079 A1 | 12/2009 | Opitz et al. | |
| 2010/0145328 A1 | 6/2010 | Hancock et al. | |
| 2011/0121247 A1 | 5/2011 | Houser et al. | |
| 2012/0020436 A1 | 1/2012 | Wu et al. | |

FOREIGN PATENT DOCUMENTS

EP        1211344 B1    6/2002

OTHER PUBLICATIONS

"Digital Dial", http://www.massmind.org/images/www/hobby_elec/e_ckt10.htm, Apr. 7, 2010, pp. 1-2.

* cited by examiner

*Primary Examiner* — Khai Tran
(74) *Attorney, Agent, or Firm* — Hogan Lovells US LLP (57) ABSTRACT

A system and method for decoding quadrature signals includes a quadrature signal generator, a quadrature signal decoder, a key matrix and a driver. The quadrature signal generator generates quadrature signals on rotation. The quadrature signal decoder is configured to convert the quadrature signals into non-overlapping signals. The key matrix is configured to receive the non-overlapping signals. The driver is configured to scan the key matrix to decode the non-overlapping signals to generate an event update corresponding to a direction of rotation of the quadrature signal generator.

20 Claims, 4 Drawing Sheets

QUADRATURE SIGNAL DECODING USING A DRIVER

RELATED APPLICATION

The present application claims priority of Indian Patent Application No. 2605/DEL/2009 filed Dec. 15, 2009, which is incorporated herein in its entirety by this reference.

FIELD OF THE INVENTION

The present invention relates to quadrature signal generators. The present invention has particular utility in systems for decoding quadrature signals using a driver.

BACKGROUND

Appliances, such as washing machines, audio-video players and set top boxes, include one or more quadrature signal generators on their respective user interfaces. Examples of quadrature signal generators include, but are not limited to, incremental rotary encoders and hall effect sensors.

In general, the quadrature signal generators track motion and determine an angular position and velocity of a shaft by providing two outputs that are 90° out of phase with each other. In other words, the quadrature signal generators provide quadrature signals in response to movement of the shaft. Such quadrature signals can be decoded either by a microcontroller or by an integrated circuit (IC) dedicated for the purpose.

Generally, several bytes of memory are consumed by coding instructions, which are written in the microcontroller, to decode the quadrature signals. In addition, extra lines or cables are required to interface the microcontroller with the incremental rotary encoder. The burden becomes even more pronounced in complex applications where the microcontroller has to attend to critical tasks as well. On the other hand, ICs that are used for the purpose of decoding quadrature signals are not just complex to implement, but are also cost ineffective. In addition, the ICs occupy a substantial fraction of the board real estate.

SUMMARY

This summary is provided to introduce concepts related to decoding of quadrature signals using a driver, which are further described below in the detailed description. This summary is not intended to identify essential features of the claimed subject matter nor is it intended for use in determining or limiting the scope of the claimed subject matter.

In one embodiment, the system includes a quadrature signal generator, a quadrature signal decoder, a key matrix, and a driver. The quadrature signal generator generates a plurality of quadrature signals on rotation. The quadrature signal decoder is configured to convert the plurality of quadrature signals into non-overlapping signals. The key matrix is configured to receive the non-overlapping signals. Further, the driver scans the key matrix to decode the non-overlapping signals and generate an event update corresponding to a direction of rotation of the quadrature signal generator.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

FIG. 2($a$) illustrates an exemplary configuration of a quadrature signal decoder, in accordance with an embodiment of the present subject matter.

FIG. 2($b$) is a graphical representation of quadrature signals provided by a quadrature signal generator and plots of non-overlapping signals generated by the quadrature signal decoder, in accordance with an embodiment of the present subject matter.

DETAILED DESCRIPTION OF PREFERRED EMBODIMENTS

The disclosed subject matter relates to decoding of signals using a driver. Particularly, the subject matter relates to the decoding of quadrature signals generated by a quadrature signal generator.

Typically, to facilitate and simplify operation of appliances, such as DVD players and washing machines, one or more quadrature signal generators, for example, incremental rotary encoders are provided with the appliances. The quadrature signal generator generates quadrature signals corresponding to rotation of the quadrature signal generator in a clockwise or a counter clockwise direction. Decoding of the quadrature signals is generally achieved through a set of instructions in the microcontroller. Based on whether the quadrature signal generator has moved clockwise or counter clockwise, the microcontroller chooses a specific action. The specific action may include actions, such as updating the LED display unit, increasing volume/channel, decreasing brightness, etc.

However, the aforementioned scheme consumes substantial code space within the microcontroller, which can be used instead for other critical tasks. In addition, the interconnections between the quadrature signal generator and the microcontroller make the appliances unnecessarily complex. Therefore, some schemes utilize dedicated integrated circuits (ICs) for the purpose of decoding quadrature signals. However, the dedicated ICs add to the overall cost of the appliances and are also area consuming.

The present subject matter relates to a system and method for decoding quadrature signals with reduced complexity and minimal cost. In one implementation, a light emitting diode (LED) driver having a key matrix interface is used to decode the quadrature signals generated by quadrature signal generators, such as incremental rotary encoders, hall effect sensors, etc. Such an LED driver may be already present in the appliances, for example, to drive eight segment LED display units.

The LED display units, formed from multiple LEDs, are generally provided as a part of a user interface of the appliances. The LED drivers are designed to drive the LEDs connected in either a common anode or a common cathode configuration. Further, the LED driver is coupled to a key matrix, which is a matrix of keys or switches. Such a key matrix is also a part of the user interface of the appliances. An event such as a key press or a key release can be decoded by the LED driver by scanning the key matrix. For the purpose, each key is individually coupled between a key input and a segment output of the LED driver. The LED driver scans the segment outputs and key inputs in one scanning cycle, and if any key is pressed, the LED driver senses the key press and updates an internal storage element.

Further, the LED driver sends an interrupt signal to a microcontroller. The microcontroller accordingly reads the storage element and takes a decision for subsequent action corresponding to the key press. The LED display unit, which is coupled to the LED driver, may or may not be updated depending on the action taken by the microcontroller. In a similar manner, the key release event is decoded.

Therefore, the LED drivers are enriched with a number of functionalities, for example, capability of driving multiple LEDs, controlling brightness of LEDs, decoding key matrix, and interfacing with the microcontroller. The present subject matter relates to configuring such a driver associated with the key matrix interface to decode the quadrature signals in a manner similar to the detection of a key press.

In the present implementation, the system for decoding quadrature signals includes a quadrature signal decoder, a key matrix, and a driver. The quadrature signal decoder converts a plurality of quadrature signals into non-overlapping signals. The key matrix is configured to receive the non-overlapping signals. Further, the driver scans the key matrix to decode the non-overlapping signals.

Devices that can implement the disclosed quadrature signal decoding using driver include, but are not limited to, automobile dashboards, set-top boxes, computing devices, washing machines, video cassette recorders (VCRs), digital versatile disc (DVD) players, microwave ovens, refrigerators, and other white goods.

Figure 1:
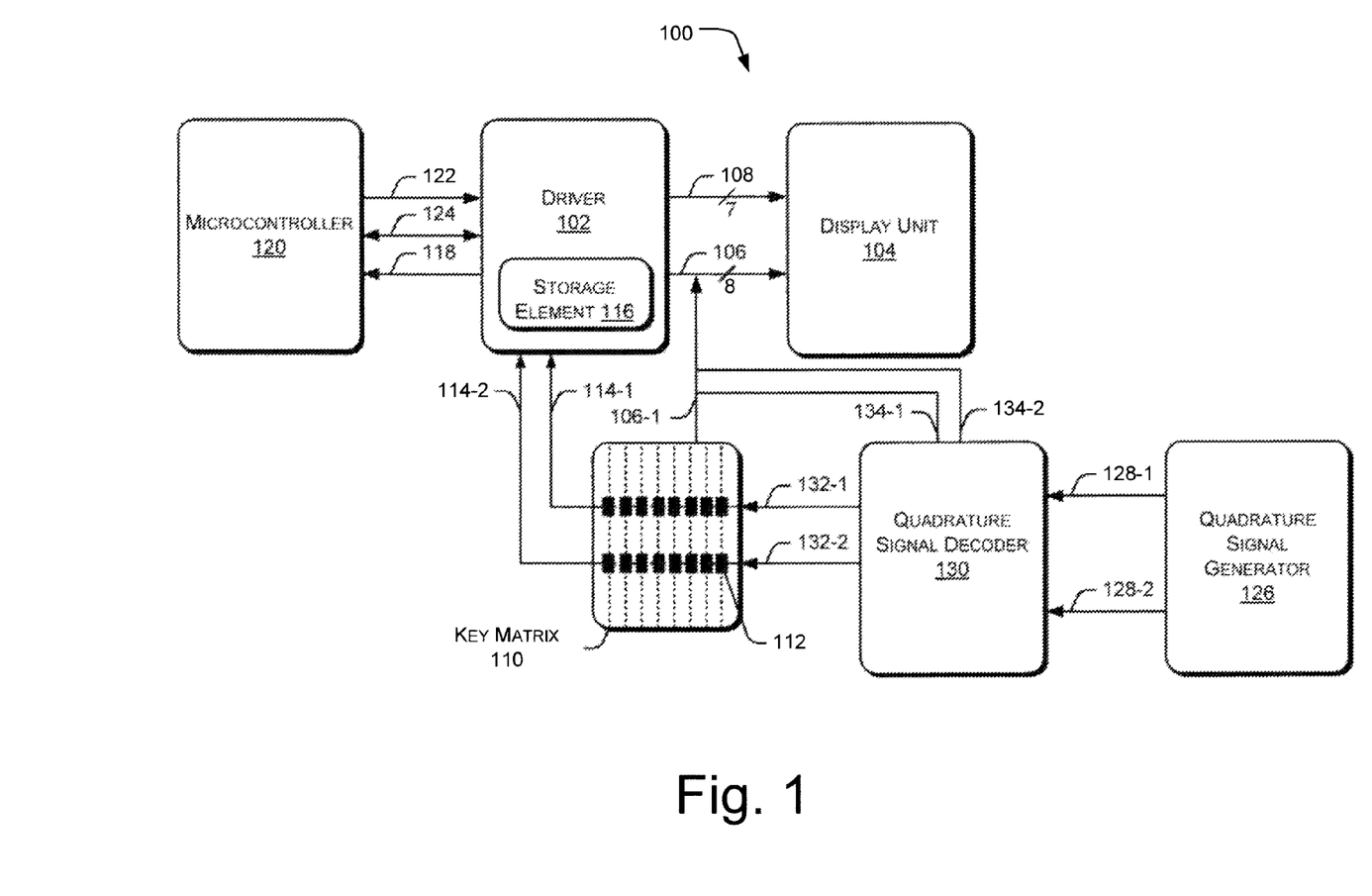
FIG. 1 illustrates an exemplary system for decoding quadrature signals, in accordance with an embodiment of the present subject matter.

FIG. 1 illustrates an exemplary system 100 for decoding quadrature signals. The system 100 includes a driver 102 configured to drive a display unit 104. The driver 102 may be a light emitting diode (LED) driver configured to drive an eight segment, six digit LED display unit. Alternatively, the driver 102 may be a vacuum fluorescent display (VFD) driver designed to drive a VFD display unit.

The operation and construction of the system 100 is described with reference to certain examples and illustrations. The examples, in no way, should be construed to be limiting. In the description to follow, the LED driver and the LED display unit have been used to explain the operation of the system 100. However, it will be appreciated that the following description extends to various driver-display unit configurations in accordance with the present subject matter. Accordingly, some variations may be possible with a change in the driver-display unit configuration, as will be understood by a person skilled in the art.

The driver 102 may be a common anode LED driver, which can be used to drive multiple LEDs (not shown in this figure) using segment outputs 106 and digit outputs 108. There can be eight segment outputs 106-1, 106-2, . . . , 106-8, for an eight segment LED display unit and six digit outputs 108-1, 108-2, . . . , 108-6, for driving six digits of the LED display unit. Additionally, there may be one more digit output 108-7 for driving all the digits simultaneously.

The driver 102 adjusts the current provided to each of the LEDs through an external resistor in conformance with current rating of the LEDs. In the common anode configuration, the segment outputs 106 sink current from cathodes of the LEDs, while the digit outputs 108 source current to anodes of the LEDs.

The driver 102 may be coupled to a key matrix 110 that serves as a user interface or part of the user interface. The key matrix 110 is formed using a set of switches or keys 112, usually arranged in a grid or matrix form. The keys 112 are located at the intersection points of rows and columns of the key matrix 110. Typically, an event, for example, a key press or a key release, is decoded by a driver by scanning the rows and the columns in a specific manner. For the purpose, the rows are coupled to key inputs of a driver and the columns are coupled to segment outputs of the driver. For example, in a 8×2 key matrix 110, two rows are coupled to two key inputs of the driver 102, namely key input 114-1 and key input 114-2, while eight columns are coupled to the eight segment outputs 106 of the driver 102. For illustration purposes, a segment output 106-1 is depicted as one of the eight segment outputs 106. The driver 102 is configured to sequentially scan the segment outputs 106 and the key inputs 114-1 and 114-2 to decode an event like a key press or a key release.

In case a key from amongst the keys 112 is pressed by the user, the row and column corresponding to that key get coupled. Subsequently, the driver 102 scans each column one by one to determine a location of the depressed key. Such a scan of the key matrix 110 yields that the current in the key input is equal to the current in the corresponding segment output, thereby giving the driver 102 an indication that a specific key is pressed.

The key press may be de-bounced to ensure that the key has indeed been pressed. Once the location of the depressed key has been correctly determined, a storage element 116 within the driver 102 is updated with, for example, the location of the depressed key. In one implementation, the storage element 116 is a register.

Furthermore, the driver 102 generates an interrupt signal 118 and provides the interrupt signal 118 to a microcontroller 120. The microcontroller 120 can generate and receive signals, for example, the interrupt signal 118, clock signal 122, etc., based on operational instructions. Among other capabilities, the microcontroller 120 is configured to provide data 124 to the driver 102. The data 124 can be in provided in the form of commands. Examples of such commands include configuration commands to configure the driver 102 for displaying the location of the depressed key, data read commands for reading the location of the depressed key, and memory write commands for writing in a memory of the microcontroller 120. In response to every interrupt signal 118, the microcontroller 120 interfaces with the driver 102 to read the storage element 116 and take an appropriate action depending on the application. In one example, the microcontroller 120 facilitates display of a value of the depressed key on the display unit 104 through the driver 102.

In addition to the above mentioned components, the system 100 includes a quadrature signal generator 126. Examples of the quadrature signal generator 126 include, but are not limited to, incremental rotary encoders, hall effect sensors and optical tachometers. The quadrature signal generator 126 is capable of generating quadrature signals, namely quadrature signal 128-1 and quadrature signal 128-2, hereinafter collectively referred to as quadrature signals 128. The quadrature signals 128 are 90° out of phase with each other. Based on whether the quadrature signal generator 126 is turned in a clockwise or a counter clockwise direction, one of the two quadrature signals 128 either lags or leads with respect to the other. Thus, the lead-lag relationship between the quadrature signals 128 helps in determining the speed and the direction of rotation of a component, say a shaft, integral to the quadrature signal generator 126.

To this end, the quadrature signals 128 are decoded in two phases. In a first phase, a quadrature signal decoder 130 coupled to the quadrature signal generator 126 decodes the quadrature signals 128 to generate non-overlapping signals 132, which are then decoded by the driver 102 in a second phase. This is further elaborated in the subsequent paragraphs.

In the first phase, the quadrature signal decoder 130 converts the quadrature signals 128-1 and 128-2 into non-overlapping signals 132-1 and 132-2, respectively, based on the direction of rotation of the quadrature signal generator 126. In one implementation, when the quadrature signal generator 126 rotates in a clockwise direction, the quadrature signal decoder 130 converts the quadrature signal 128-1 into the non-overlapping signal 132-1, while providing a zero signal at the non-overlapping signal 132-2. Similarly, when the quadrature signal generator 126 rotates in a counter clock wise direction, the quadrature signal decoder 130 converts the quadrature signal 128-2 into the non-overlapping signal 132-2, while providing a zero signal at the non-overlapping signal 132-1.

The non-overlapping signals 132-1 and 132-2 obtained on the first and the second output terminals, respectively, of the quadrature signal decoder 130 are coupled to the key inputs 114-1 and 114-2, respectively. On the other hand, the complementary signals of the two non-overlapping signals, namely complementary non-overlapping signals 134-1 and 134-2 obtained on third and fourth output terminals, respectively, of quadrature signal decoder 130, are coupled to a segment output of the driver 102, for example, the segment output 106-1. In such a configuration, the user interface is reduced to a 7×2 key matrix, as one segment output is being used for the purpose of decoding the quadrature signals.

In operation, whenever there is a clockwise rotation of the quadrature signal generator 126, the non-overlapping signal 132-1 and the complementary non-overlapping signal 134-1 are obtained at the first and third output terminals of the quadrature signal decoder 130, respectively in the first phase. Due to the configuration described earlier, the non-overlapping signal 132-1 and the complementary non-overlapping signal 134-1 also appear at the key input 114-1 and segment output 106-1 respectively.

In the second phase of decoding the quadrature signals 128, the driver 102 scans the key matrix 110, row by row and column by column. When the driver 102 scans the key matrix 110, it appears as if a current from the segment output 106-1 is being sinked, while an equivalent current is being sourced to the key input 114-1. This gives an impression that a first key has been pressed. Accordingly, the driver 102 also considers the rotation of the quadrature signal generator 126 as a key press and updates its storage element 116 with an event update of the key press. Subsequently, the driver 102 sends the interrupt signal 118 to the microcontroller 120.

Similarly, whenever the quadrature signal generator 126 rotates in a counter clock wise direction, the non-overlapping signal 132-2 and the complementary non-overlapping signal 134-2 are obtained at the second and fourth output terminals of the quadrature signal decoder 130, respectively. Again, when the driver 102 scans the key matrix 110, it appears as if a current from the segment output 106-1 is being sinked, while a current is being sourced to the key input 114-2, thus giving an impression that a second key has been pressed. The storage element 116 is updated with an event update to indicate that the second key located at the intersection of key input 114-2 and segment output 106-1 is depressed, and the interrupt signal 118 is generated by the driver 102.

In response to the interrupt signal 118, the microcontroller 120 reads the event update in the storage element 116. Based on the reading, the microcontroller 120 may facilitate various actions, for instance, updating the display unit 104, increasing volume/channel, and decreasing brightness. In one example, the microcontroller 120 facilitates display of the direction of rotation of the quadrature signal generator 126 onto the display unit 104 through the driver 102.

Thus, the quadrature signals 128 can be decoded using existing scanning logic of the key matrix 110 present in the system 100. As the algorithm for decoding of the key press or release events is already implemented in the microcontroller 120, no additional coding is required for decoding of key press or release events created due to the quadrature signals 128. In addition, the number of connections to the microcontroller 120 are also limited, thus reducing the overall cost and complexity of the application in which the system 100 is implemented. An exemplary configuration of the quadrature signal decoder 130 is elaborated in subsequent figures to further illustrate its operation.

Figure 2A:
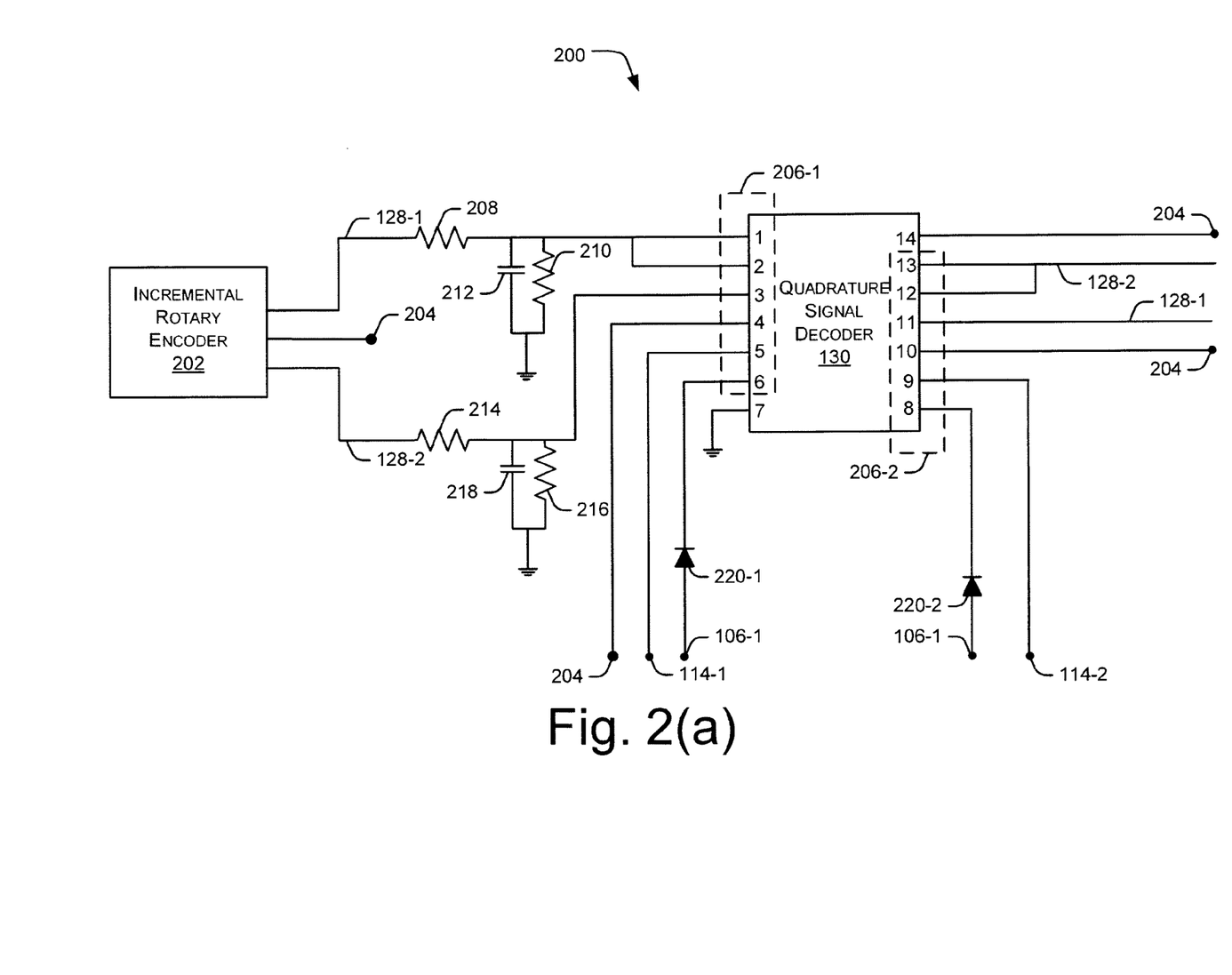
Figure 2B:
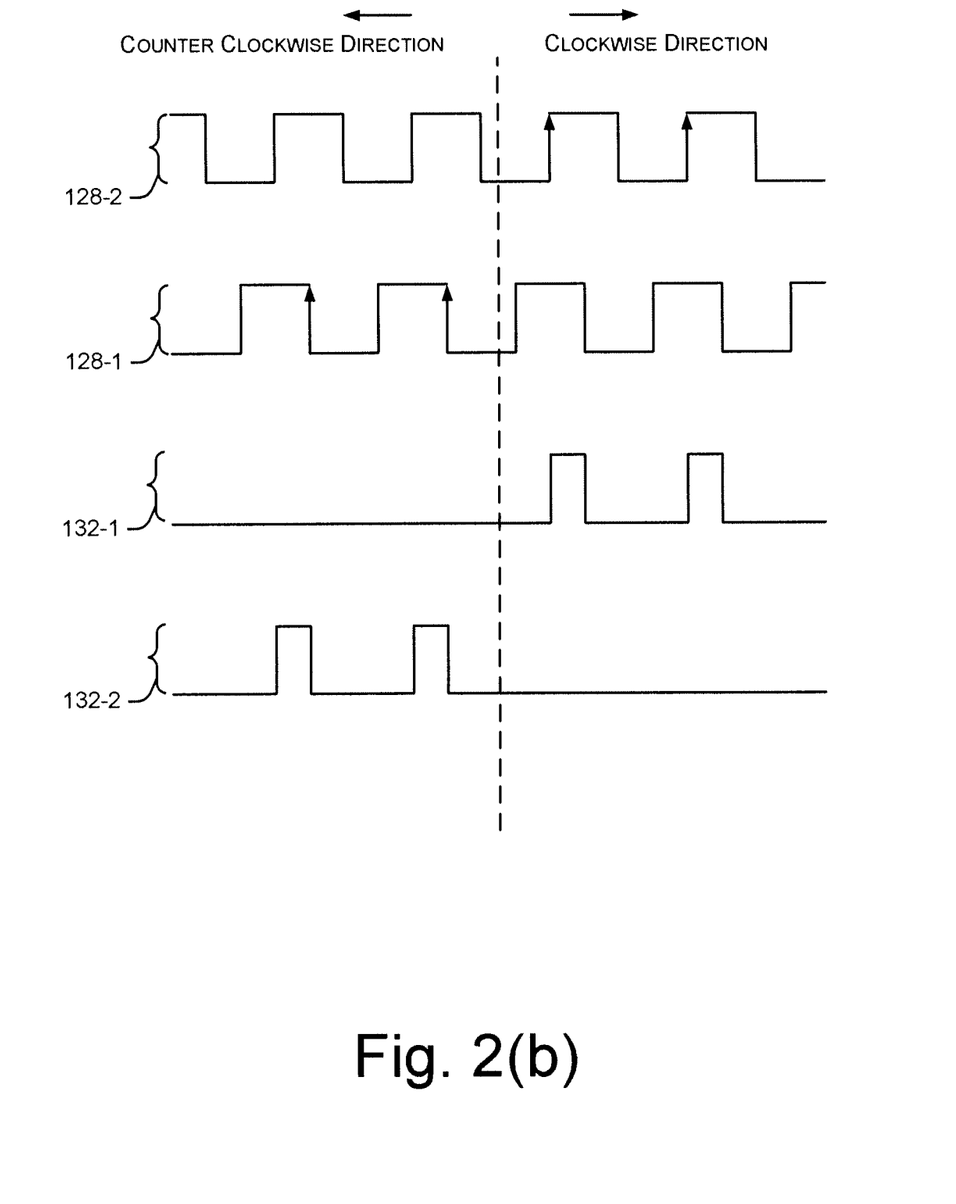

FIG. 2(a) illustrates an exemplary configuration 200 of the quadrature signal decoder 130. FIG. 2(b) is a graphical representation of the quadrature signals 128, provided by the quadrature signal generator 126, and plots of the non-overlapping signals 132-1 and 132-2 generated by the quadrature signal decoder 130.

In one implementation, the quadrature signal generator 126 may be a rotary encoder, for example, an incremental rotary encoder 202. Generally, the incremental rotary encoder 202 is used in applications and devices that require precise shaft rotation, for example, in robotics, photographic lenses, computer input devices (mice and trackballs), and volume control applications. The illustration, hereinafter, is in terms of the incremental rotary encoder 202. However, the explanation can be extended to any device that generates square wave or quadrature signals, for example, a hall effect sensor or an optical tachometer, though with a few modifications, as will be appreciated by a person skilled in the art.

As mentioned in the description of FIG. 1, the incremental rotary encoder 202 generates the quadrature signals 128 in response to the rotation of a shaft (not shown in this figure). In construction, the incremental rotary encoder 202 is typically a three-terminal device that generates quadrature signals, for example, the quadrature signal 128-1 and the quadrature signal 128-2, at two of its terminals, while the third terminal is pulled up at a supply voltage such as $V_{CC}$ 204 (say 5 volts). The quadrature signals 128-1 and 128-2 generated by the incremental rotary encoder 202 are illustrated in FIG. 2(b). The quadrature signals 128-1 and 128-2 are 90° out of phase with each other.

The incremental rotary encoder 202 is coupled to a quadrature signal decoder 130, in accordance with one embodiment of the present subject matter. Also, in said embodiment, the quadrature signal decoder 130 is coupled to the key matrix 110 in order to facilitate decoding of the direction of rotation of the shaft integral to the incremental rotary encoder 202.

Further, the quadrature signal decoder 130 may be a dual flip flop, such as IC 7474. The quadrature signal decoder 130 may be alternatively implemented using a combination of two D-flip flops or any other flip flops, such as reset-set (RS) flip flops, which provide similar functionalities. Although the present subject matter has been explained in considerable details with respect to IC 7474, however, it will be appreciated that any other IC capable of latching the quadrature signals 128-1 and 128-2 may be used. Additionally, any IC configured to convert two overlapping signals into non-overlapping signals may be implemented within the quadrature signal decoder 130. Accordingly, connections to various pins of the quadrature signal decoder 130 may be modified according to the requirements of the application, as will be understood by a person skilled in the art.

In said embodiment, the quadrature signal decoder 130 is a 14-pin IC that functions as a dual D-flip flop. Thus, the quadrature signal decoder 130 may be considered as an IC having two flip flops 206-1 and 206-2. Pins 1 through 6 of the IC are included in the flip flop 206-1, while pins 8 through 13 are included in the flip flop 206-2. Pins 7 and 14 of the IC are common between the flip flops 206-1 and 206-2.

In operation, pin 7 is coupled to ground and pin 14 is coupled to $V_{CC}$ 204. Pin 2 of the flip flop 206-1 is coupled to receive quadrature signal 128-1 through passive elements, such as a resistor 208, a resistor 210, and a capacitor 212. Pin 3 receives quadrature signal 128-2, also through passive elements, such as a resistor 214, a resistor 216, and a capacitor 218. The quadrature signal 128-2 serves as a clock signal for flip flop 206-1. The flip flop 206-1 provides an output signal at pin 5 and a complementary output signal at pin 6.

Further, pin 12 is coupled to receive the quadrature signal 128-2 through one or more passive elements (not shown in this figure). Likewise, pin 11 receives quadrature signal 128-1 through the passive elements. The quadrature signal 128-1 serves as a clock signal for the flip flop 206-2. The flip flop 206-2 provides an output signal at Pin 9 and a complementary output signal at Pin 8.

Pins 4 and 10 are provided for asynchronous setting of the flip flops 206-1 and 206-2, respectively. To this end, the pins 4 and 10 are tied to the $V_{CC}$ 204. In addition, pins 1 and 13 are provided for asynchronous resetting of the flip flops 206-1 and 206-2 and are, therefore, tied to the quadrature signals 128-1 and 128-2, respectively. Moreover, when in operation, pin 7 is coupled to ground and pin 14 is coupled to VCC 204. Pins 6 and 8 are coupled to one of the segment outputs of the driver 102, for example, to the segment output 106-1.

A current protection diode, for example, diodes 220-1 and 220-2 may be coupled to the segment output 106-1 to protect the display unit 204 from a large reverse current. Further, pin 5 is coupled to the key input 114-1 and pin 9 is coupled to the key input 114-2.

In operation, when the incremental rotary encoder 202 is rotated in a clockwise direction, the flip flop 206-1 gets activated and the non-overlapping signal 132-1 is provided. A waveform of the non-overlapping signal 132-1, is further illustrated in FIG. 2(b). As shown in FIG. 2(b), when the incremental rotary encoder 202 is rotated in the clockwise direction, the non-overlapping signal 132-1 follows the quadrature signal 128-1 based on the timing of the clock signal, in this case, the quadrature signal 128-2. For example, until a positive transition of the quadrature signal 128-2, the non-overlapping signal 132-1 is at a low level even though the quadrature signal 128-1 is at a high level. Now, until the level of the quadrature signal 128-2 is high, the non-overlapping signal 132-1 follows the quadrature signal 128-1.

Thus, at the positive transition of the quadrature signal 128-2 applied at the pin 3, the non-overlapping signal 132-1 is obtained at pin 5, and a complementary non-overlapping signal 134-1 is obtained at pin 6. Since the pin 5 is coupled to the key input 114-1 and the pin 6 is coupled to the segment output 106-1, it appears as if a current is flowing from the segment output 106-1 to the key input 114-1, thus giving the driver 102 an impression that a first key is pressed.

Similarly, when the incremental rotary encoder 202 is rotated in a counter clockwise direction, the flip flop 206-2 gets activated and the non-overlapping signal 132-2 is provided. A waveform of the non-overlapping signal 132-2 is shown in FIG. 2(b). As seen from the figure, when the incremental rotary encoder 202 is rotated in the counter clock wise direction, the non-overlapping signal 132-2 follows the quadrature signal 128-2 until the clock signal, in this case, the quadrature signal 128-1 is at a high level. Thus, at a positive transition of the quadrature signal 128-1 applied on the pin 11, the non-overlapping signal 132-2 is obtained at the pin 9 and a complementary non-overlapping signal 134-2 is obtained at the pin 8. Since the pin 9 is coupled to the key input 114-2 and the pin 8 is coupled to the segment output 106-1, it appears as if the segment output 106-1 is the source of current and the key input 114-2 is a sink, thus giving an impression that a key is pressed.

Once a key press is detected in response to a rotation of the incremental rotary encoder 202 in a clockwise or a counter clockwise direction, the storage element 116 within the driver 102 gets updated and the interrupt signal 118 gets generated, as already described in FIG. 1.

In another embodiment, instead of using the complementary non-overlapping signals 134-1 and 134-2, an additional transistor may be implemented as a switch. Alternatively, the transistor can be implemented in a common emitter configuration. For example, a base terminal of the transistor may receive input from the non-overlapping signal 132-1, while the collector and emitter terminals of the transistor may be coupled to the segment output 106-1 and the key input 114-1, respectively. In yet another embodiment, the base terminal of the transistor may receive input from a complementary non-overlapping signal, for example, complementary non-overlapping signal 134-1.

In this way, a driver, such as the driver 102 having an integrated key matrix scanning feature, can be used to decode the quadrature signals 128 in a manner similar to the detection of a key press or a key release event.

Figure 3:
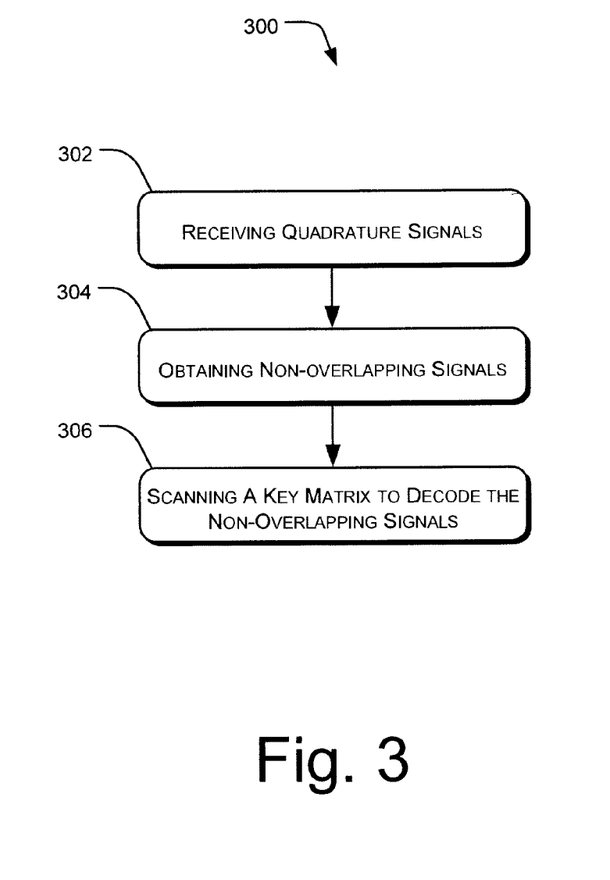
FIG. 3 illustrates an exemplary method diagram for decoding quadrature signals using a driver, in accordance with an embodiment of the present subject matter.

FIG. 3 illustrates an exemplary method 300 for decoding quadrature signals using a driver. The exemplary method may be described in the general context of analog and digital circuit elements. However, it will be noted that the method is also implementable through computer executable instructions.

The order in which the method is described is not intended to be construed as a limitation, and any number of the described method blocks can be combined in any order to implement the method, or an alternative method. Additionally, individual blocks may be deleted from the method without departing from the spirit and scope of the subject matter described herein. Furthermore, the methods can be implemented in any suitable hardware, software, firmware, or combination thereof.

At block 302, quadrature signals are received from a quadrature signal generator. For example, the quadrature signal generator 126 generates quadrature signals 128 based on a direction of rotation of the incremental rotary encoder 202.

At block 304, non-overlapping signals are obtained from the quadrature signals. The quadrature signals 128 obtained from the quadrature signal generator 126, such as the incremental rotary encoder 202, are fed to a quadrature signal decoder 130 to yield non-overlapping signals 132-1 and 132-2. In one implementation, the quadrature signal decoder 130 is implemented using two flip flops, for example, the flip flops 206-1 and 206-2.

In response to a clockwise rotation of the quadrature signal encoder 126, flip flop 206-1 is activated. As a result, the non-overlapping signal 132-1 follows the quadrature signal 128-1 until the level of quadrature signal 128-2 is high. Alternatively, for a counter clockwise rotation of the quadrature signal generator 126, the non-overlapping signal 132-2 follows the quadrature signal 128-2 as long as the level of quadrature signal 128-1 is high. In said implementation, the complementary non-overlapping signals 134-1 and 134-2 can also be generated by the flip flops 206. Alternatively, the complementary non-overlapping signals 134-1 and 134-2 may be generated using a transistor in a common emitter configuration.

At block 306, a key matrix is scanned to decode the non-overlapping signals. In one implementation, each of the non-overlapping signals 132-1 and 132-2 are coupled to a corresponding key on the key matrix 110, while each of the complementary non-overlapping signals are coupled to the common segment output, for example, segment output 106-1. Each key is coupled to a key input and a common segment output The driver 102 scans the segment output 106-1 and key inputs 114-1 and 114-2 in one scanning cycle, and if the driver 102 senses that a current from the segment output 106-1 is being sinked, while a current is being sourced to the key input 114-1, the driver 102 registers it as a key press event. Furthermore, the driver 102 updates the storage element 116 with an event update corresponding to the registered key press event and subsequently, generates the interrupt signal 118 for the microcontroller 120. Accordingly, the microcontroller 120 may facilitate various actions, for instance, updating the display unit 104, increasing volume/channel, and decreasing brightness based on the event update.

Although embodiments for quadrature signal decoding using driver have been described in language specific to structural features and/or methods, it is to be understood that the invention is not necessarily limited to the specific features or methods described. Rather, the specific features and methods are disclosed as exemplary embodiments for the quadrature signal decoding using the driver.

We claim:

1. A system comprising:
   a quadrature signal generator operative to generate quadrature signals on rotation;
   a quadrature signal decoder operative to convert the quadrature signals into non-overlapping signals;
   a key matrix operative to receive the non-overlapping signals; and
   a driver coupled to the key matrix and operative to decode the non-overlapping signals and generate an event update corresponding to a direction of rotation of the quadrature signal generator,
   wherein the quadrature signal generator is selected from a group of an incremental rotary encoder, an optical tachometer, and a hall effect sensor.

2. The system as claimed in claim 1, wherein the key matrix transfers each of the non-overlapping signals to the driver through a corresponding key input.

3. The system as claimed in claim 1, wherein a segment output of the driver is coupled to complementary signals of the non-overlapping signals.

4. The system as claimed in claim 1, further comprising:
   a transistor coupled at a collector terminal to a segment output of the driver,
   wherein a base terminal of the transistor receives one of the non-overlapping signals.

5. The system as claimed in claim 1, wherein the key matrix receives each of the non-overlapping signals through a corresponding transistor.

6. The system as claimed in claim 1 further comprising:
   a microcontroller coupled to the driver,
   wherein the driver sends an interrupt signal to the microcontroller to indicate generation of the event update.

7. The system as claimed in claim 6, wherein the microcontroller facilitates a pre-determined action based on the interrupt signal.

8. The system as claimed in claim 6 further comprising:
   a display unit coupled to the driver,
   wherein the microcontroller facilitates display of the direction of rotation of the quadrature signal generator onto the display unit through the driver.

9. The system as claimed in claim 1, wherein the driver comprises a storage element to store the event update.

10. A system comprising:
    a quadrature signal generator operative to generate quadrature signals on rotation;
    a quadrature signal decoder operative to convert the quadrature signals into non-overlapping signals;
    a key matrix operative to receive the non-overlapping signals; and
    a driver coupled to the key matrix and operative to decode the non-overlapping signals and generate an event update corresponding to a direction of rotation of the quadrature signal generator,
    wherein a segment output of the driver is coupled to complementary signals of the non-overlapping signals.

11. The system as claimed in claim 10, wherein the key matrix transfers each of the non-overlapping signals to the driver through a corresponding key input.

12. The system as claimed in claim 10, wherein the quadrature signal generator is selected from a group of an incremental rotary encoder, an optical tachometer, and a hall effect sensor.

13. The system as claimed in claim 10, further comprising:
    a transistor coupled at a collector terminal to a segment output of the driver, wherein a base terminal of the transistor receives one of the non-overlapping signals.

14. The system as claimed in claim 10, wherein the key matrix receives each of the non-overlapping signals through a corresponding transistor.

15. The system as claimed in claim 10 further comprising:
    a microcontroller coupled to the driver,
    wherein the driver sends an interrupt signal to the microcontroller to indicate generation of the event update.

16. The system as claimed in claim 15, wherein the microcontroller facilitates a pre-determined action based on the interrupt signal.

17. The system as claimed in claim 15 further comprising:
    a display unit coupled to the driver,
    wherein the microcontroller facilitates display of the direction of rotation of the quadrature signal generator onto the display unit through the driver.

18. The system as claimed in claim 10, wherein the driver comprises a storage element to store the event update.

19. A system comprising:
    a quadrature signal generator operative to generate quadrature signals on rotation;
    a quadrature signal decoder operative to convert the quadrature signals into non-overlapping signals;
    a key matrix operative to receive the non-overlapping signals; and
    a driver coupled to the key matrix and operative to decode the non-overlapping signals and generate an event update corresponding to a direction of rotation of the quadrature signal generator,
    wherein the key matrix receives each of the non-overlapping signals through a corresponding transistor.

20. A system comprising:
    a quadrature signal generator operative to generate quadrature signals on rotation;
    a quadrature signal decoder operative to convert the quadrature signals into non-overlapping signals;

a key matrix operative to receive the non-overlapping signals; and a driver coupled to the key matrix and operative to decode the non-overlapping signals and generate an event update corresponding to a direction of rotation of the quadrature signal generator, wherein the driver comprises a storage element to store the event update.

\* \* \* \* \*